US010510432B1

United States Patent
Shen

(10) Patent No.: US 10,510,432 B1
(45) Date of Patent: Dec. 17, 2019

(54) MEMORY MODULE TEST ADAPTER

(71) Applicant: SMART Modular Technologies, Inc., Newark, CA (US)

(72) Inventor: Jinying Shen, San Ramon, CA (US)

(73) Assignee: SMART Modular Technologies, Inc., Newark, CA (US)

( * ) Notice: Subject to any disclaimer, the term of this patent is extended or adjusted under 35 U.S.C. 154(b) by 213 days.

(21) Appl. No.: 15/659,420

(22) Filed: Jul. 25, 2017

(51) Int. Cl.
*G11C 29/56* (2006.01)
*G06F 11/22* (2006.01)
*G06F 11/263* (2006.01)
*G06F 12/16* (2006.01)
*G11C 5/04* (2006.01)
*G06F 3/06* (2006.01)

(52) U.S. Cl.
CPC ...... *G11C 29/56016* (2013.01); *G06F 3/0614* (2013.01); *G06F 11/2205* (2013.01); *G06F 11/263* (2013.01); *G06F 12/16* (2013.01); *G11C 5/04* (2013.01)

(58) Field of Classification Search
CPC ... G11C 29/56016; G11C 5/04; G06F 3/0614; G06F 11/263; G06F 11/2205; G06F 12/16
USPC .............................................. 324/756.05, 537
See application file for complete search history.

(56) References Cited

U.S. PATENT DOCUMENTS 4,475,079 A * 10/1984 Gale ...................... G01R 31/11
324/533
2014/0266285 A1* 9/2014 Detofsky ........... G01R 31/2889
324/756.05

* cited by examiner

*Primary Examiner* — Farhana A Hoque
(74) *Attorney, Agent, or Firm* — Wong & Rees LLP

(57) ABSTRACT

Approaches, techniques, and mechanisms are disclosed for a test adapter designed to improve testability of non-volatile dual in-line memory modules (NVDIMM) on automatic test equipment (ATE) testers or in-system boards, which have inadequate power supplies. An NVDIMM includes both volatile memories and non-volatile memories. A test adapter is designed to supply increased power to an NVDIMM. A test adapter is implemented using an interposer or a printed circuit board (PCB) that may be inserted into a socket on an ATE tester or on an end-user system-level board. The interposer or PCB includes a power socket for attaching a power cable to supply the external power supply to the NVDIMM. A power on/off sequence is controlled by an ATE tester to simulate or test a system power on/off sequence. An external input power is always on, but both serial and backup power signals are only on during tests of an NVDIMM.

19 Claims, 10 Drawing Sheets

MEMORY MODULE TEST ADAPTER

TECHNICAL FIELD

Embodiments relate generally to a test system, and, more specifically, to techniques for testing memory modules.

BACKGROUND

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

Automatic test equipment (ATE) for testing electronic circuits typically operate under control of a set of instructions called a test program. The test program is loaded in an ATE tester and executes in the hardware of the tester, which generally includes an embedded processor (e.g., a workstation-class microprocessor or any other microcontroller). The embedded processor is often referred to as a central processing unit (CPU) that performs higher-level data management and control functions for the tester. Test programs on a tester for testing large and complex circuits are generally large and complex themselves. These test programs require extensive development and debugging effort by numerous test design engineers. The test programs have to be developed quickly and accurately to meet rapid development times for prototype and production circuits. A program development and execution environment for ATE test programs play an important role in the success of these efforts.

Testers have evolved over the years. Many testers have substantial investments in test programs and programming environments. Software for legacy systems cannot simply be replaced by new programming technology because it embodies capabilities that can take a large engineering effort to duplicate in its entirety. On the other hand, legacy systems, being based on old technologies, tend to fail to meet current expectations for performance, features, ease of use, stability, and reliability.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

Figure 1:
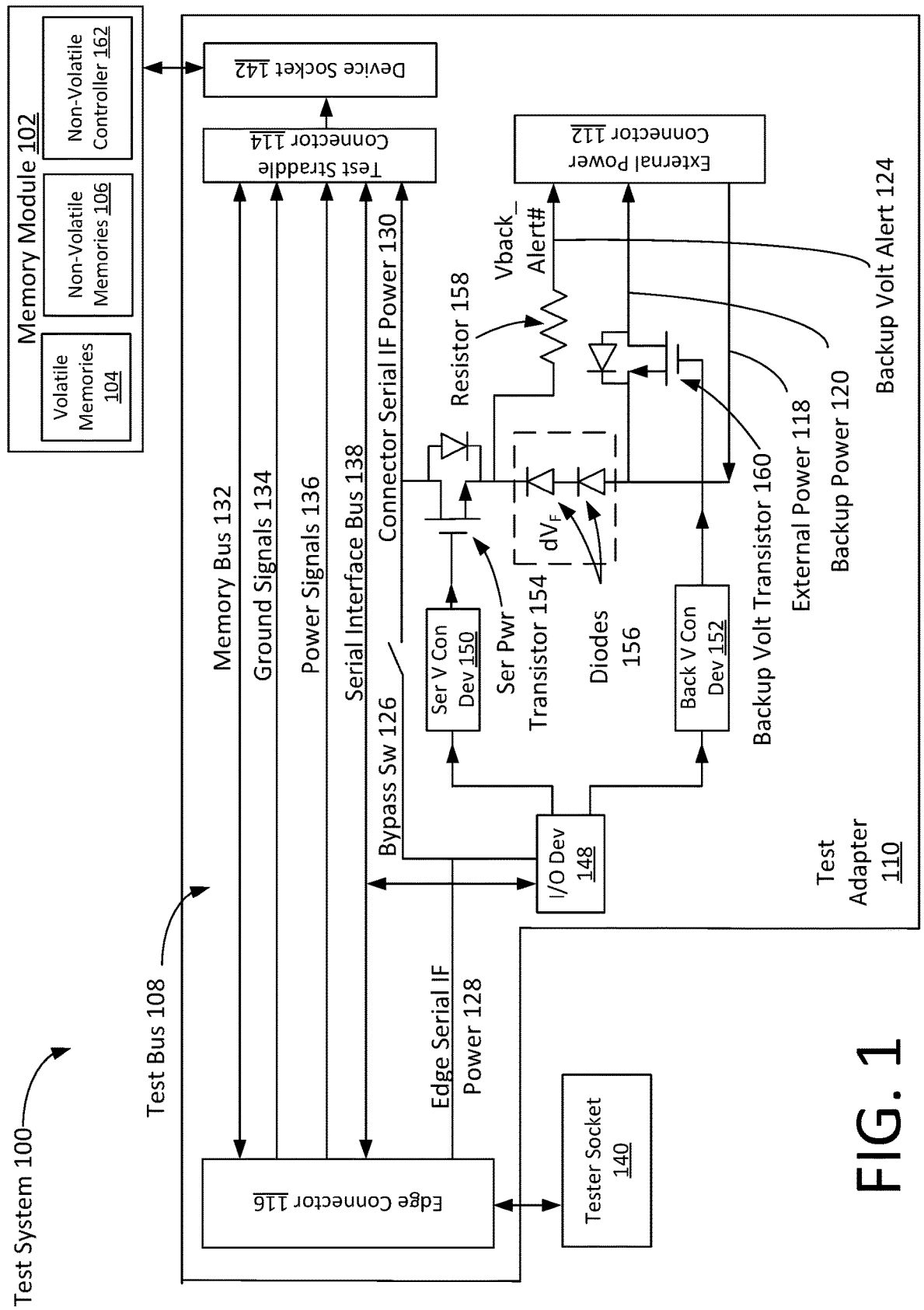
FIG. 1 is an illustrative view of various aspects of an example test system, according to an embodiment.

In the following description, for the purposes of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present invention.

Embodiments are described herein according to the following outline:

1.0. General Overview
    2.0. System Overview
    3.0. Structure Overview
    3.1. Test Adapter
    3.2. Power Cable
    3.3. Test Cable Diagram
    3.4. Test Adapter Isometric View
    3.5. Multiple Adapters
    3.6. Example Process Flow
    4.0. Example Embodiments
    5.0. Extensions and Alternatives

1.0. General Overview

Approaches, techniques, and mechanisms are disclosed for a test adapter designed to improve testability of non-volatile dual in-line memory modules (NVDIMM) on ATE testers and in-system boards, which have inadequate power supplies. An NVDIMM includes both volatile memories (e.g., random-access memories (RAM), synchronous dynamic random-access memories (SDRAM), or any other volatile memory) and non-volatile memories (e.g., NAND flash memories, solid-state memories, or any other electronic non-volatile computer storage media), as examples. The test adapter is designed to interface with memory modules and ATE testers or in-system boards and provides sufficient power to test these NVDIMMs.

According to an embodiment, a test adapter is designed to supply increased power to an NVDIMM using an external power supply so that an ATE tester is able to perform functionality tests for both volatile and non-volatile memories on an NVDIMM. A test adapter is implemented using a straddle connector or socket attached to an interposer or a printed circuit board (PCB) that may be inserted into another connector or socket on an ATE tester or on an end-user system-level board. The interposer or PCB includes a power connector that is mounted at an exterior surface of the interposer or PCB. A power cable is plugged into the power connector to supply the external power supply through the test adapter to the NVDIMM. The test adapter provides an ATE test supporting device that has a capability to supply enough current for a serial present detect (SPD) voltage pin, denoted as VDDSPD, and a backup voltage (VBACK) power for both normal ATE volatile memory tests and NVDIMM backup and restore tests. For example, each of the current demands may be greater than 10 milliamps (mA). As a specific example, each of the current demands may be greater than or equal to 500 mA.

Existing ATE testers are designed to supply power to test memory modules with only SDRAMs. This power is provided by the ATE testers to a VDDSPD of a straddle connector or a socket. Existing ATE testers for memory modules (e.g., DDR3 or any other superseding DDR interface) do not supply sufficient power for a VDDSPD rail to support an NVDIMM normal operation and, additionally, sufficient power for backup voltage (VBACK) for backup hardware (HW) circuit tests after a memory module power supply, denoted as VDD/VTT, is turned off. Such insufficient power supplied to VDDSPD and VBACK prevents an NVDIMM HW from being fully tested in an initial HW test stage. For example, the ATE testers may provide a limited amount of power up to approximately 10-15 mA of current for VDDSPD. Such limited power does not allow the ATE testers to test NVDIMMs that have not only volatile but also non-volatile (NV) memories. It is understood that testability of the NVDIMMs on the ATE testers for memory modules (e.g., for DDR3 or any other DDR interface that supersedes DDR3) are not currently defined by Joint Electron Device Engineering Council (JEDEC). Thus, the test adapter described herein is needed to provide sufficient power for VDDSPD and VBACK for ATE tests to perform an NVDIMM HW test to achieve 100% test coverage in production or end-user systems.

According to an embodiment, a power on/off sequence is detailed. The power on/off sequence is controlled by an ATE tester to simulate or test a system power on/off sequence to properly powering on or off connector serial interface power and backup power. During testing of volatile memories on an NVDIMM, connector serial interface power is supplied. Then, upon completion of functionality tests of the volatile memories, connector serial interface power and backup power are supplied by external power during backup testing of volatile memories and non-volatile memories. When connector serial interface power is not used during the backup testing, connector serial interface power is disabled. Upon completion of the backup testing, backup power is disabled. This sequence meets an NVDIMM power on/off sequence guideline.

According to an embodiment, an external input power is always on. However, the external input power supplied for both VDDSPD and VBACK power signals are only on during tests of volatile or non-volatile memories of an NVDIMM for safe operation. Among other benefits, this limitation on the supplied external input power prevents unnecessary power consumption by turning off power that is not necessary during testing of the NVDIMM.

2.0. System Overview

FIG. 1 is an illustrative view of various aspects of an example test system 100 in which the techniques described herein may be practiced, according to an embodiment. The illustrative view depicts an example of a system block diagram of test system 100. For example, test system 100 may represent, without limitation, an automatic test equipment (ATE) or any other test system. Test system 100 includes a combination of hardware and software configured for testing electronic circuits or boards.

For example, test system 100 may be utilized to test memory modules 102, such as non-volatile dual in-line memory modules (NVDIMMs) or any other computer memory module. Also for example, an NVDIMM may retain data even when electrical power is removed either from an unexpected power loss, a system crash, or a normal system shutdown by saving or backing up the data from volatile memories 104 to non-volatile memories 106.

Among many benefits, NVDIMMs are used to improve application performance, data security, system crash recovery time, and enhance solid-state drive (SSD) endurance and reliability. NVDIMMs use volatile memories 104 during normal (e.g., non-test) operations and a dedicated power source to allow the NVDIMMs to save data into on-board non-volatile memories 106 in case of a system power loss.

Test system 100 includes a test bus 108 that is used to transmit electrical signals for power, control, data, or any other electrical signal. For example, test system 100 may be used as a hardware test platform to test NVDIMMs using an off-the-shelf ATE test bus with double-data rate (DDR) protocols, such as DDR SDRAM, DDR2 SDRAM, DDR3 SDRAM, DDR4 SDRAM, or any other class of memory integrated circuits used in computers.

Test system 100 is used to test various types of dual in-line memory modules (DIMMs) with a different number of pins and form factors that are used to test memory modules 102. For example, these DIMMs may include 204-pin small outline dual in-line memory modules (SO-DIMMs) for DDR3 SDRAM, 214-pin MicroDIMMs for DDR2 SDRAM, 240-pin DIMMs for DDR2 SDRAM, DDR3 SDRAM, and fully buffered DIMMs (FB-DIMMs) for dynamic random-access memory (DRAM), 244-pin MiniDIMMs for DDR2 SDRAM, 260-pin SO-DIMMs for DDR4 SDRAM, 260-pin SO-DIMMs with different notch positions than on DDR4 SO-DIMMs for UniDIMMs that carry either DDR3 or DDR4 SDRAM signals, 288-pin DIMMs for DDR4 SDRAM, or any other types of DIMMs.

Also for example, DIMMs may include hybrid memory modules (e.g., for DDR4 or any other DDR interface), which are memory modules that may plug into DIMM sockets and appear like volatile memory modules to a system controller, yet contain non-volatile (NV) memories, such as NAND Flash, on the modules. These hybrid memory modules may be referred to as NVDIMMs and may share a memory channel with other DIMMs (e.g. for DDR4 or any other DDR interface).

Test system 100 includes a test adapter 110. Test adapter 110 includes at least an external power connector 112, a test straddle connector 114, and an edge connector 116. External power supply and ground signals are supplied from external power connector 112 to memory module 102 through test straddle connector 114. External power connector 112 connects to an external power unit that supplies power and ground signals to external power connector 112.

For illustrative purposes, test adapter 110 is shown outside tester socket 140, although it is understood that test adapter 110 may be implemented in any manner. For example, test adapter 110 may be implemented as part of, inside, or within tester socket 140 of an ATE tester.

An external power 118, denoted as Vin_Ext, may supply power for a backup power 120 of external power connector 112. External power 118 may be used with test straddle connector 114 only during testing of memory module 102, such as an NVDIMM or any other memory module.

For example, backup voltage alert 124 may be an active-low (#) signal, denoted as Vback_Alert#. Backup voltage alert 124 of "0" indicates that there is a problem with backup power 120. As an example, backup voltage alert 124 of "0" may indicate that there is no power in external power 118 for backup power 120.

Test adapter 110 includes a bypass switch 126 to bypass or deselect power from an external power supply. When bypass switch 126 is on or closed, an edge serial interface power 128 from edge connector 116 is selected to supply power for a connector serial interface power 130. Edge serial interface power 128 is supplied by an ATE.

External power 118, backup power 120, and backup voltage alert 124 are available through external power connector 112. An ATE tester uses Inter-Integrated Circuit (I2C) interface or any other serial interface to control selection of external power 118, backup power 120, backup voltage alert 124, and connector serial interface power 130.

External power 118 includes any voltage. For example, external power 118 may include an approximate range of 3.6V to 4.0V. Also for example, edge connector 116 and test straddle connector 114 may include a 240-pin form factor and a DDR interface (e.g., for DDR3 or any superseding interface).

When bypass switch 126 is open, it provides an option to deselect or disconnect connector serial interface power 130 from edge serial interface power 128. In this configuration, power supplied to connector serial interface power 130 is from external power 118.

Test bus 108 includes at least a memory bus 132, ground signals 134, power signals 136, a serial interface bus 138, and connector serial interface power 130. Memory bus 132 is an interface that transfers signals between edge connector 116 and test straddle connector 114. For example, memory bus 132 may include at least data lines (DQ), data strobes (DQs), address and command signals (ADDRES_CMD), control signals (CONTROL), clocks (CKs), input parity (Parity_In), and output error (Error_Out).

Ground signals 134 and power signals 136 are provided from edge connector 116 to test straddle connector 114. Power signals 136 (denoted as VDD, VTT, Vref_CA, and Vref_DQ) include power signals to core logic, input/output buffers/driver, electrical devices, and any other circuit of memory devices, such as volatile memories 104 and non-volatile memories 106, on memory module 102.

Serial interface bus 138 includes at least a serial data line (SDA), a serial clock (SCL), serial address lines (SA[2:0]), an active-low event signal (Event#), and an active-low save signal (SAVE_N) for data backup. Serial interface bus 138 is used to select any combination of external power 118, backup power 120, backup voltage alert 124, and edge serial interface power 128.

Edge serial interface power 128 is a power signal selected for a serial present detect (SPD) interface. Edge serial interface power 128 supplies power to test straddle connector 114 based on bypass switch 126. When edge serial interface power 128 is not used, bypass switch 126 is open or off, and a power supply from external power 118 is selected. When edge serial interface power 128 is used, bypass switch 126 is closed or on, and power from external power 118 is not selected.

A combination of edge serial interface power 128 and backup power 120 may be used for testing volatile memories 104 and non-volatile memories 106. For example, edge serial interface power 128 may be used for testing volatile memories 104. Also for example, external power 118, backup power 120, or a combination thereof may be used for testing a backup process of data from volatile memories 104 to non-volatile memories 106 and a restore process of data from non-volatile memories 106 to volatile memories 104.

In at least one embodiment, edge serial interface power 128 and external power 118 are always on. Edge serial interface power 128 or external power 118 is used by test adapter 110 to generate connector serial interface power 130, denoted as VDDSPD. External power 118 is used by test adapter 110 to generate backup power 120, denoted as VBACK. However, even though edge serial interface power 128 and backup power 120 are always on, edge serial interface power 128 or backup power 120 is selected by an ATE tester through serial interface bus 138 only just before or during functionality testing of memory module 102.

Test system 100 implements a power on/off sequence to properly power on or off connector serial interface power 130 and backup power 120. Initially before testing of memory module 102 begins, both connector serial interface power 130 and backup power 120 are not powered by a combination of edge serial interface power 128 and external power 118. Then, during testing of functionality of volatile memories 104, connector serial interface power 130 is supplied by edge serial interface power 128 or external power 118. Upon completion of functionality test of volatile memories 104, a combination of connector serial interface power 130 and backup power 120 is supplied by a combination of external power 118, backup power 120, and edge serial interface power 128 during backup and restore testing of volatile memories 104 and non-volatile memories 106. When connector serial interface power 130 is not used during the backup testing, connector serial interface power 130 is disabled by test adapter 110 by not selecting edge serial interface power 128 or external power 118. Upon completion of the backup testing, external power 118 and backup power 120 are disabled by test adapter 110 by not selecting external power 118 and backup power 120. The power on/off sequence is performed by a script or software in an ATE tester each time test adapter 110 is setup and does not have to be performed again until test adapter 110 is physically changed or removed or an ATE tester is turned off and back on again.

Edge connector 116 is physically and electrically attached or connected to a tester socket 140. For example, edge connector 116 may be formed on an interposer PCB that is inserted into tester socket 140. Also for example, tester socket 140 may be a socket mounted on a printed circuit board of an ATE.

In an embodiment, test straddle connector 114 is formed as contact pads on or attached to an interposer or PCB. For example, test straddle connector 114 may be physically attached or connected to electrical contacts or pads of a device socket 142, into which memory module 102 is inserted or installed.

In an embodiment, test straddle connector 114 is a part of or built into device socket 142. For example, test straddle connector 114 may be electrical contacts or pads of device socket 142.

In an embodiment, test adapter 110 may be implemented in a socket or a connector to which memory module 102 may be attached or inserted and tested on an ATE tester or in an end-user system environment.

Through external power connector 112, an external power supply provides external power 118. Through external power connector 112, backup power 120 supplies a test backup voltage for backup power 120 to a DUT, such as memory module 102.

An input/output expander 148 controls generation of backup power 120 and connector serial interface power 130. Input/output expander 148 generates control signals and outputs to a serial voltage control device 150 and a backup voltage control device 152. For example, each of serial voltage control device 150 and backup voltage control device 152 may be a register, a latch, a flip-flop, or any other storage element.

Test adapter 110 also includes a serial power transistor 154, diodes 156, a resistor 158, and a backup voltage transistor 160. For example, a diode connected to source and drain terminals of serial power transistor 154 or backup voltage transistor 160 may be a body diode of a metal-oxide-semiconductor FET (MOSFET) or any other transistor.

For illustrative purposes, serial power transistor 154 or backup voltage transistor 160 are shown as p-channel FETs, although it is understood that serial power transistor 154 or backup voltage transistor 160 can be any other types of transistors. For example, serial power transistor 154 or backup voltage transistor 160 can be bipolar junction transistors (BJT), junction field-effect transistors (JFET), unipolar transistors, insulated gate FET (IGFET), MOSFET, insulated-gate bipolar transistor, or any other semiconductor devices that are used to amplify or switch electronic signals and electrical power. Also, for example, serial power transistor 154 or backup voltage transistor 160 can include structures with electrical (positive and negative) polarity, such as n-p-n bipolar transistors, p-n-p bipolar transistors, n-channel FETs, p-channel FETs, or any other transistor devices.

For example, serial power transistor 154 or backup voltage transistor 160 may be n-channel FETs. In this case, serial voltage control device 150 or backup voltage control device 152 may output a logic zero (0) to gate inputs of serial power transistor 154 or backup voltage transistor 160 to turn on serial power transistor 154 or backup voltage transistor 160.

Serial voltage control device 150 and backup voltage control device 152 control generation of connector serial interface power 130 and backup power 120, respectively. For example, serial voltage control device 150 can control a base port of a bipolar transistor to enable (or disable) connector serial interface power 130 to be approximately equal to a voltage of external power 118 minus the voltage drop across diodes 156. Also, for example, backup voltage control device 152 can control a base port of a bipolar transistor to enable (or disable) backup power 120 to be approximately equal to external power 118.

Input/output expander 148 interfaces with serial interface bus 138 using an SCL and an SDA signals. Input/output expander 148 receives power from edge serial interface power 128 to operate. Input/output expander 148 includes a number of input and output (I/O) ports. Each of the I/O ports is configurable to be either an input port or an output port. The ports are configured by programming configuration registers of input/output expander 148 using the SCL and SDA signals of serial interface bus 138. Each of the I/O ports can be configured to be active high or active low.

In an embodiment, bypass switch 126 is open or disabled so that connector serial interface power 130 is not supplied by edge serial interface power 128. In this case, connector serial interface power 130 receives power from external power 118 by enabling or turning on serial power transistor 154. Input/output expander 148 can write or send a "1" to serial voltage control device 150 to enable or turn on serial power transistor 154 if serial power transistor 154 is a n-channel MOSFET or an n-p-n transistor. While serial power transistor 154 is on, backup voltage transistor 160 remains disabled or off to save power. This embodiment can be used for testing volatile memories 104 by using external power 118 from an external power supply, instead of edge serial interface power 128, for supplying power to connector serial interface power 130.

In an embodiment, bypass switch 126 is closed or enabled so that connector serial interface power 130 is supplied by edge serial interface power 128. In this case, serial voltage control device 150 and backup voltage control device 152 are disabled or off. This embodiment can be used for testing volatile memories 104 by using edge serial interface power 128 from an ATE, instead of external power 118 from an external power supply, for supplying power to connector serial interface power 130.

In an embodiment, after volatile memories 104 are tested by an ATE, memory module 102 may be further tested using power supplied by external power 118 from an external power supply unit, which provides an adequate power that is more than edge serial interface power 128 from an ATE and enough to test other circuitry in memory module 102, such as non-volatile memories 106. Backup and restore operations of memory module 102 may be tested by saving data from volatile memories 104 to non-volatile memories 106 and by restoring data from non-volatile memories 106 to volatile memories 104 to verify that memory module 102 is properly functional when there is a power failure to a power supply to memory module 102 and when the power is available again after the power failure is resolved. External power 118 that is connected through external power connector 112 may supply power to backup power 120. In this case, serial voltage control device 150 is configured to an appropriate logic level (e.g., to "0") and backup voltage control device 152 is configured to an appropriate logic level (e.g., to "1") to disable serial power transistor 154 and enable backup voltage transistor 160, respectively, if serial power transistor 154 and backup voltage transistor 160 are n-channel FETs or n-p-n transistors.

In an embodiment, a power on and off sequence may be utilized to provide a power sequence order and a predetermined duration between powering on and powering off connector serial interface power 130 and backup power 120. Initially, before any memory or functional tests begin, power is disabled for both connector serial interface power 130 and backup power 120. While bypass switch 126 is off or open, serial power transistor 154 is enabled by setting a predetermined voltage or logic level at the output of serial voltage control device 150 to supply power to connector serial interface power 130 based on external power 118. Then, power is supplied to backup power 120 by enabling backup voltage transistor 160 by setting a predetermined voltage or logic level at the output of backup voltage control device 152. The system waits at least a predetermined amount of time before disabling serial power transistor 154. The predetermined amount of time enables an overlap of time when both connector serial interface power 130 and backup power 120 are on before connector serial interface power 130 is disabled. The predetermined amount of time between turning on backup power 120 and turning off connector serial interface power 130 allows memory module 102 to be continuously powered during a period of switching power of connector serial interface power 130 and backup power 120. For example, the predetermined amount of time may be at least 5 micro-seconds (µs).

In an embodiment, diodes 156 are connected in series between external power connector 112 and serial power transistor 154 to provide a potential difference between external power 118 and connector serial interface power 130. A difference between voltages of connector serial interface power 130 and external power 118 is approximately equal to a voltage drop ($dV_F$) across diodes 156 that are connected to each other in series, as shown inside a box with dash lines.

Connector serial interface power 130 has a voltage that is lower than a voltage at external power 118. The difference between voltages of connector serial interface power 130 and external power 118 enables detection of connector serial interface power 130 and external power 118. When a voltage of external power 118 is measured and the voltage is different from a voltage measured for connector serial interface power 130, it indicates that backup voltage transistor 160 is properly turned on. It can be difficult to identify whether backup voltage transistor 160 is properly turned on if diodes 156 are not used and voltages of connector serial interface power 130 and external power 118 are approximately the same.

For example, a total voltage drop across diodes 156 can have an approximate range of 0.5V-0.6V. Also, for example, each of diodes 156 may have approximately the same voltage drop compared to each other.

Test system 100 is but one example of a system in which the techniques described herein may be practiced. Other systems in which the techniques described herein may be practiced may comprise fewer or additional elements in varying arrangements.

In an embodiment, an ATE tester or system may access only volatile memories 104. The ATE tester or system may not access non-volatile memories 106, which may be tested only by a non-volatile controller 162 of memory module 102. Non-volatile controller 162 may test non-volatile memories 106 with commands sent from the ATE or system to non-volatile controller 162.

3.0. Structure Overview

3.1. Test Adapter

Figure 2:
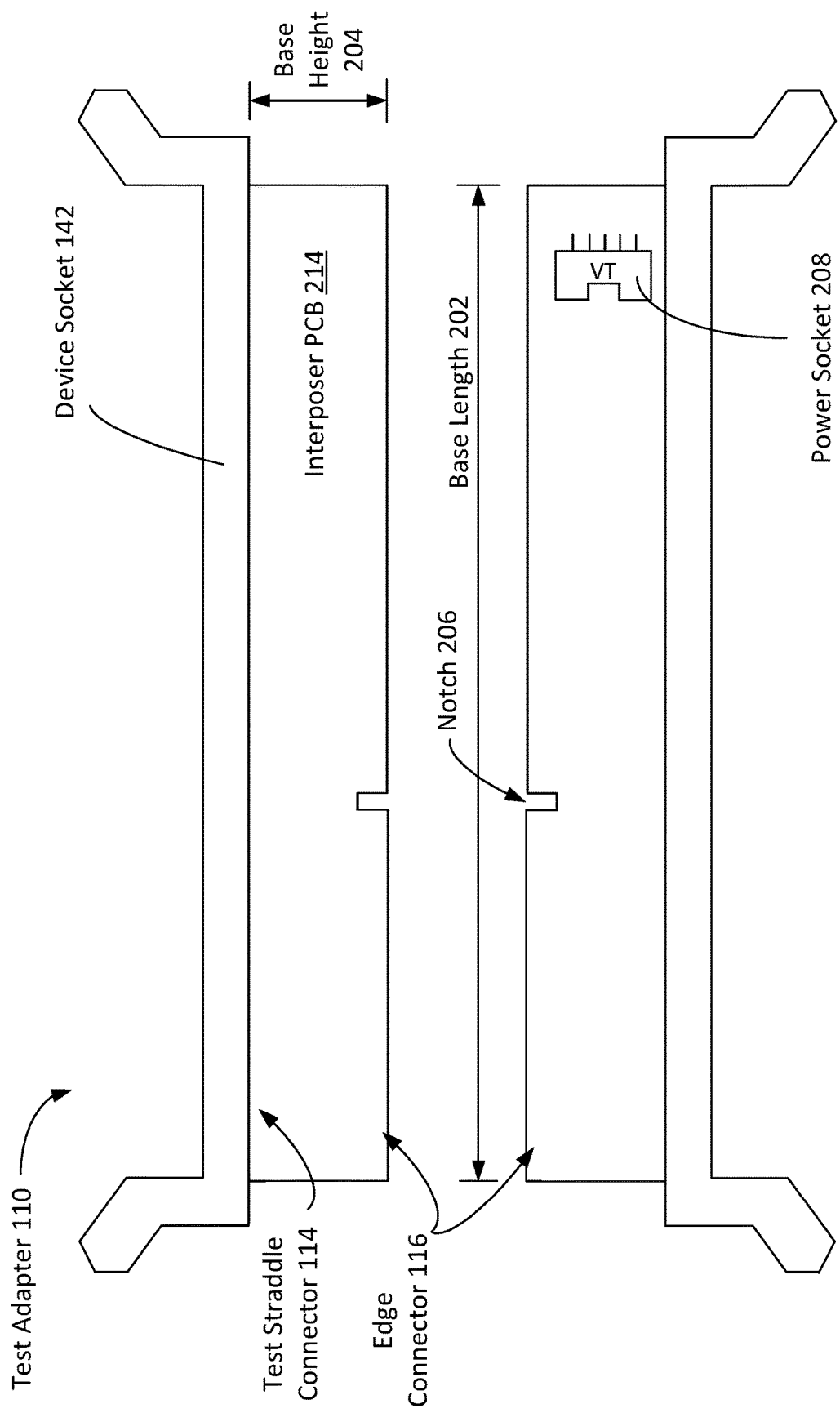
FIG. 2 is an illustrative view of an example test adapter, according to an embodiment.

FIG. 2 is an illustrative view of an example test adapter 110, according to an embodiment. FIG. 2 is only one example of a manner in which a test adapter 110 may be implemented in accordance with the described techniques. In other embodiments, a test adapter 110 may be implemented using process flows that include fewer or additional elements, with different structures and/or arrangements. The example depicts a first side view of test adapter 110 at the top of FIG. 2 and a second side view of test adapter 110 at the bottom of FIG. 2. The second side view is opposite to the first side view.

In an embodiment, test adapter 110 may be mounted directly over a socket on an ATE tester. In another embodiment, test adapter 110 maybe mounted on a daughter card, which may be physically and electrically connected to a socket on an ATE tester. It is understood that an NVDIMM that is plugged or inserted into test adapter 110 may also be able to plugged into a socket on an ATE because test adapter 110 and the socket are compatible in pin configurations and form factors. Test adapter 110 may function as an interposer between memory module 102 and a socket on an ATE tester.

Test adapter 110 includes a base length 202 and a base height 204. Base length 202 and base height 204 are dimensions of interposer PCB 214 of test adapter 110, whereby interposer PCB 214 is below a connection portion that receives memory module 102. Base length 202 is a horizontal dimension between vertical sides of interposer PCB 214. Base height 204 is a vertical dimension between horizontal sides of interposer PCB 214. Base length 202 and base height 204 include any lengths. For example, base length 202 and base height 204 may be 133.35 millimeter (mm) and 18.75 mm, respectively.

Interposer PCB 214 includes a key notch 206. Key notch 206 is an indentation that is used as a key for inserting an adapter or an interposer into a socket or a connector on an ATE tester. The location of key notch 206 may be anywhere along a bottom side of interposer PCB 214. For example, the location of key notch 206 may be configured to be at a position at the bottom side of interposer PCB 214 for inserting interposer PCB 214 into a socket that supports DDR3 DIMMs or a DIMM for any other DDR interface. The position of key notch 206 can be offset from the center along base length 202 of interposer PCB 214 to prevent inserting the interposer PCB 214 backward in a socket on an ATE tester. For example, key notch 206 is positioned to the left, the center, or the right of the area between pins 52 and 53 of interposer PCB 214. This is used to indicate the I/O voltage for the DDR DIMM and to prevent installing the wrong type of DIMM into a socket that might damage the DIMM.

The second side view depicts test adapter 110 having a power socket 208, denoted as VT, mounted on an exterior sidewall of test adapter 110. Power socket 208 is attached near an end of test adapter 110. Power socket 208 includes any number of pins. For example, power socket 208 may have 5 pins. Power socket 208 includes pins that are adjacent to a vertical side of test adapter 110. Among other benefits, power socket 208 is vertically attached near a vertical side of test adapter 110 so that it can be easier to plug or attach cables to test adapter 110.

Test adapter 110 includes device socket 142 and edge connector 116. Device socket 142 is used for inserting or attaching memory module 102 to test adapter 110. Device socket 142 is attached or connected to test straddle connector 114 of interposer PCB 214. Edge connector 116 connects to a daughter board, which is attached to an ATE tester, or is directly attached to a socket or a straddle connector of an ATE tester.

3.2. Test Connector

Figure 3:
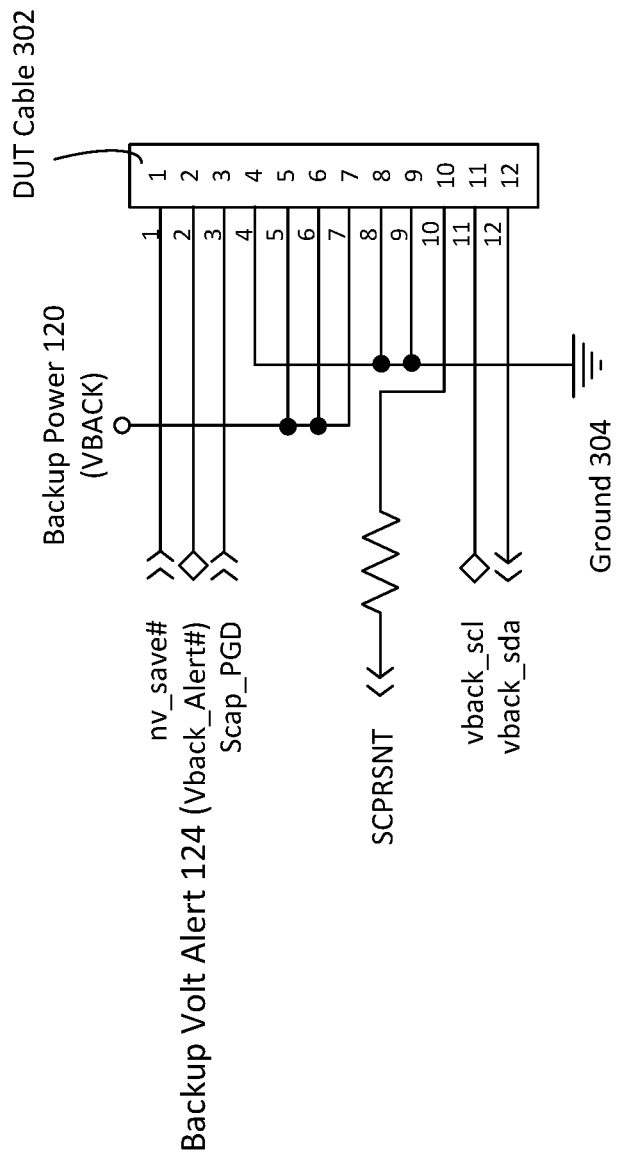
FIG. 3 is an example pin diagram of a device-under-test (DUT) cable, according to an embodiment.

FIG. 3 is an example pin diagram of a device-under-test (DUT) cable 302, according to an embodiment. FIG. 3 is only one example of a manner in which DUT cable 302 may be implemented in accordance with the techniques described herein. In other embodiments, DUT cable 302 may be implemented using manufacture flows that include fewer or additional elements, with different wire configurations and/or a number of wires.

DUT cable 302 is connected to test adapter 110 and memory module 102. One end of DUT cable 302 is connected to test adapter 110 and the other end of DUT cable 302 is connected to memory module 102. DUT cable 302 includes a number of pins or wires. For illustrative purposes, DUT cable 302 is shown with twelve pins or wires. Backup power 120 and ground 304 are connected to DUT cable 302.

DUT cable 302 includes a wire that is used by an ATE tester to initiate a command (nv_save#) for memory module 102 to start a backup process. For example, wire 1 of DUT cable 302 may be used for nv_save# to instruct memory module 102 to save data in memory module 102, such as an NVDIMM or any other hybrid memory module.

DUT cable 302 includes a wire that is used for backup voltage alert 124. Backup voltage alert 124 indicates that there is a problem with backup power 120. For example, backup voltage alert 124 may indicate that there is no power in external power 118 for backup power 120.

3.3. Test Cable

Figure 4:
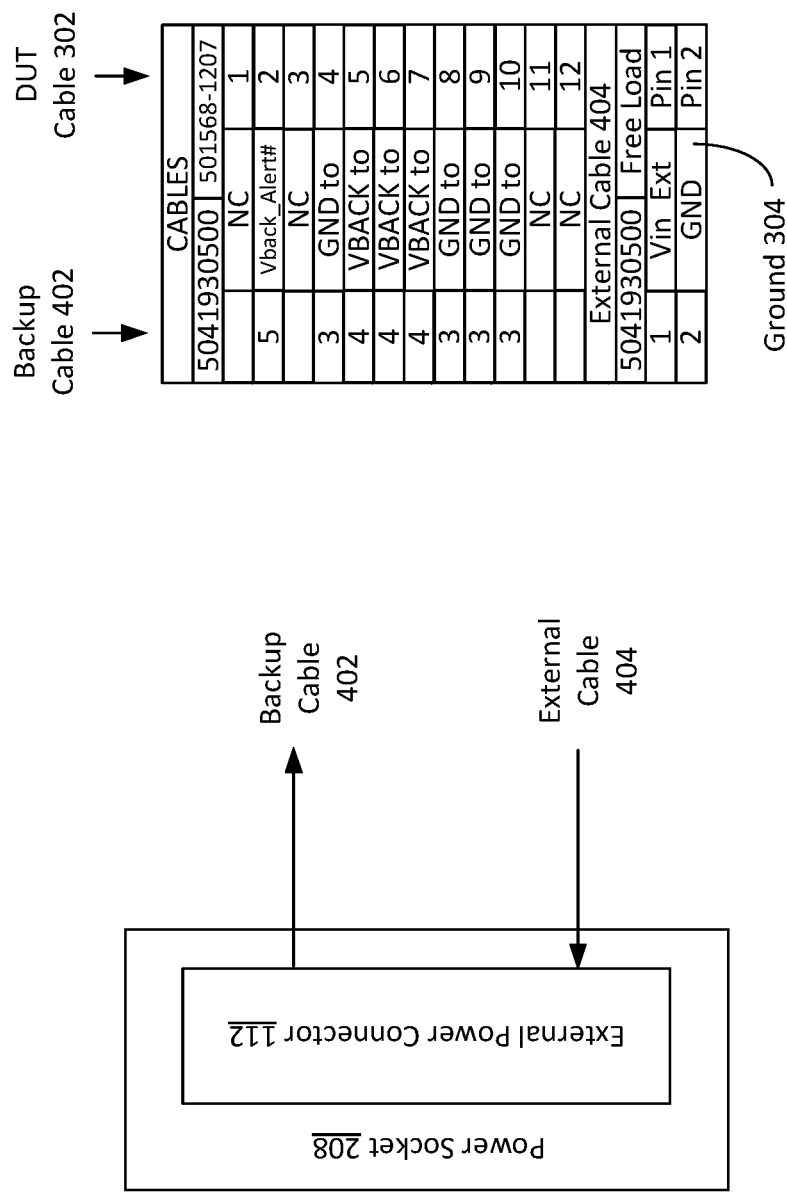
FIG. 4 is an example of a test cable diagram, according to an embodiment.

FIG. 4 is an example of a test cable diagram, according to an embodiment. FIG. 4 is only one example of a manner in which a backup cable 402 and an external cable 404 may be connected in accordance with the described techniques. In other embodiments, backup cable 402 and power cable 404 may be implemented using manufacture flows that include fewer or additional elements, with different wire configuration and/or a number of wires.

Test adapter 110 connects wires of backup cable 402 to wires of DUT cable 302. Backup cable 402, external cable 404, and DUT cable 302 include any number of wires. For illustrative purposes, backup cable 402, external cable 404, and DUT cable 302 may have 3, 2, and 12 wires, respectively. For example, backup cable 402 and external cable 404 may include altogether 5 wires, which may be connected to a 5-pin power socket 208 attached to an exterior sidewall of test adapter 110. Also for example, test adapter 110 may connect 5 wires of backup cable 402 and external cable 404 to 12 pre-defined wires of DUT cable 302.

Backup cable 402 and external cable 404 are connected to test adapter 110. One end of backup cable 402 is connected to DUT cable 302 and the other end of backup cable 402 is connected to external power connector 112 of power socket 208. One end of external cable 404 is connected to an external power supply and the other end of external cable 404 is connected to external power connector 112 of power socket 208.

Backup power 120 and ground 304 wires of DUT cable 302 are supplied via any wires of backup cable 402. For example, backup power 120 of backup cable 402 may be supplied to wires 5-7 of DUT cable 302, and ground 304 of backup cable 402 may be supplied to wires 4 and 8-10 of DUT cable 302.

Edge serial interface power 128 and external power 118 may be selected for connector serial interface power 130 and backup power 120, respectively, after memory module 102 is inserted into test adapter 110, and backup cable 402, external cable 404, and DUT cable 302 are connected to external power connector 112 and memory module 102. Among many benefits, connector serial interface power 130 and backup power 120 selected only just before and during functionality testing of memory module 102 provides a safe operation and does not unnecessarily draw power from power supplies during normal (e.g., non-testing) operations of memory module 102.

For example, an ATE tester may use interface bus 138 to send a command to control selection of external power 118 and edge serial interface power 128 for generation of backup power 120 and connector serial interface power 130 before volatile memories 104 and non-volatile memories 106 are tested. Also, for example, an ATE tester may be an I2C master of interface bus 138 and a memory module 102 may be a slave of interface bus 138. Further, for example, a memory module 102 may also be an I2C master on an I2C bus associated with VBACK of DUT cable 302, and so interface bus 138 may not be routed to the VBACK I2C bus.

3.4. Adapter Isometric View

Figure 5:
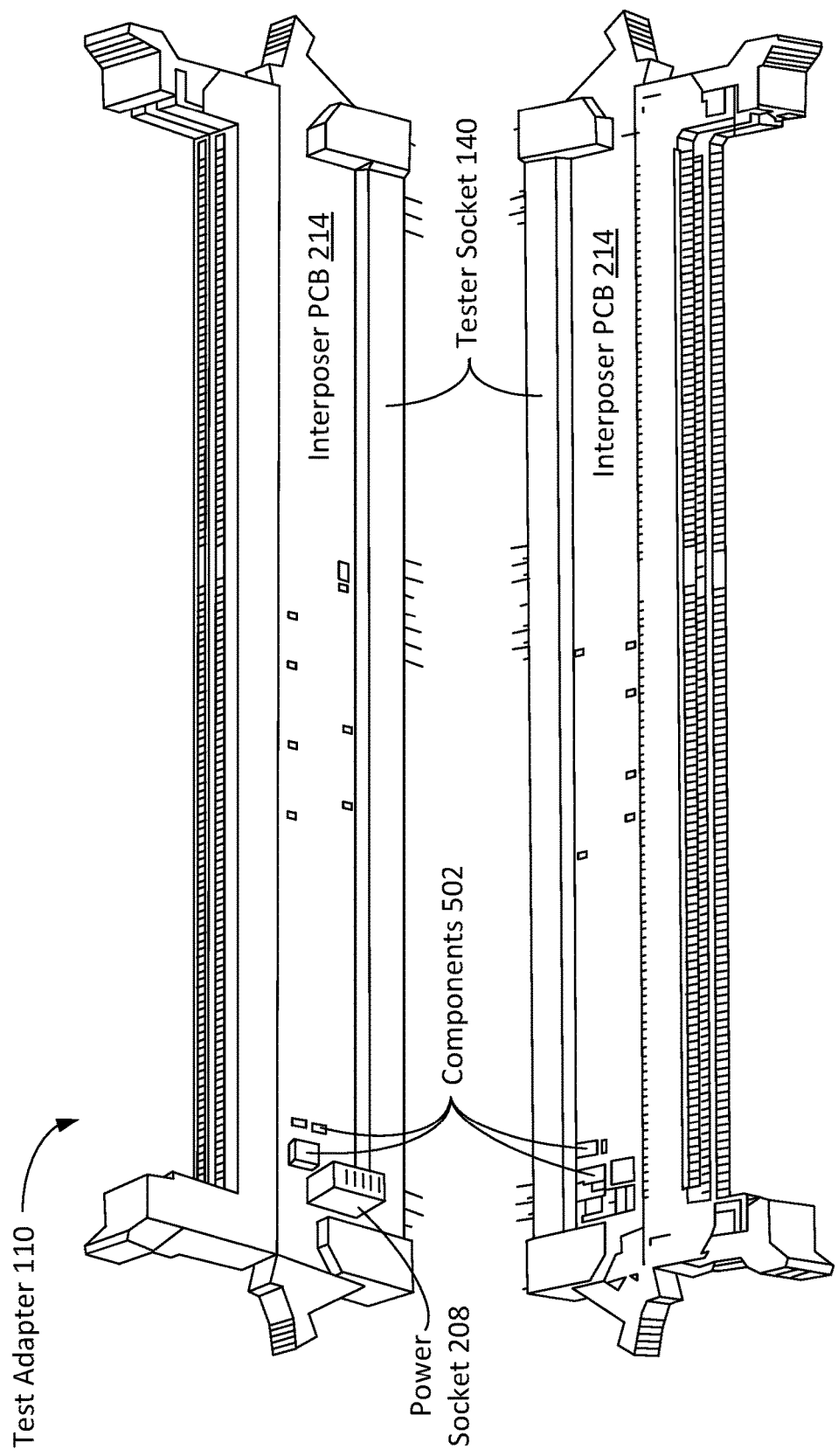
FIG. 5 is an example isometric view of a test adapter, according to an embodiment.

FIG. 5 is an example isometric view of a test adapter 110, according to an embodiment. The example isometric view depicts a first isometric top view of test adapter 110 at the top of FIG. 5 and a second isometric top view of test adapter 110 at the bottom of FIG. 5. The second isometric top view is opposite to the first isometric top view.

In the first isometric top view, test adapter 110 includes power socket 208 attached to an exterior sidewall interposer PCB 214 of test adapter 110. One end of external cable 404 is connected to power socket 208. One end of backup cable 402 is connected to power socket 208. Interposer PCB 214 includes components 502, such as hardware blocks of interposer PCB 214 shown in FIG. 1, mounted on an exterior sidewall of interposer PCB 214. For example, the components 502 include at least input/output device 148, serial voltage control device 150, backup voltage control device 152, serial power transistor 154, diodes 156, resistor 158, and backup voltage transistor 160. For illustrative purposes, power socket 208 or the components 502 may be mounted or attached at an end of interposer PCB 214 or anywhere at an interior portion of an exterior sidewall of interposer PCB 214.

In at least one embodiment, test adapter 110 may be implemented using a printed circuit board (PCB). For example, interposer PCB 214 of test adapter 110 may include 6 layers, namely layers 1-6. Layer 1, or a top layer, may be used for mounting components 502 and routing signals to or from components 502. Layer 2 may be a plane used for ground (GND) and power (e.g., VDD or any other power signal). Layer 3 may be a plane used for GND. Layer 4 may be a plane used for power, such as VDDSPD, VBACK, or any other power signal. Layer 5 may be a plane used for GND and power (e.g., VDD or any other power signal). Layer 6, or a bottom layer, may be used for mounting components 502 and routing signals to or from components 502.

Impedance matching for single-ended (SE) and differential (DIFF) signals on memory module 102 may be provided by test adapter 110. The impedance matching is implemented for any impedance values. For example, SE and DIFF signals may have 60 ohms and 100 ohms for impedance matching, respectively.

Interposer PCB 214 may be inserted into tester socket 140. Edge connector 116 on interposer PCB 214 may be formed at an edge or a peripheral surface of interposer PCB 214 to allow interposer PCB 214 to attach and electrically connect to tester socket 140. For example, tester socket 140 may be mounted on an ATE tester mainframe. Device socket 142 may be attached to interposer PCB 214. A dual in-line memory module (DIMM) DUT, such as memory module 102, may be inserted into device socket 142.

3.5. Multiple Test Adapters

Figure 6:
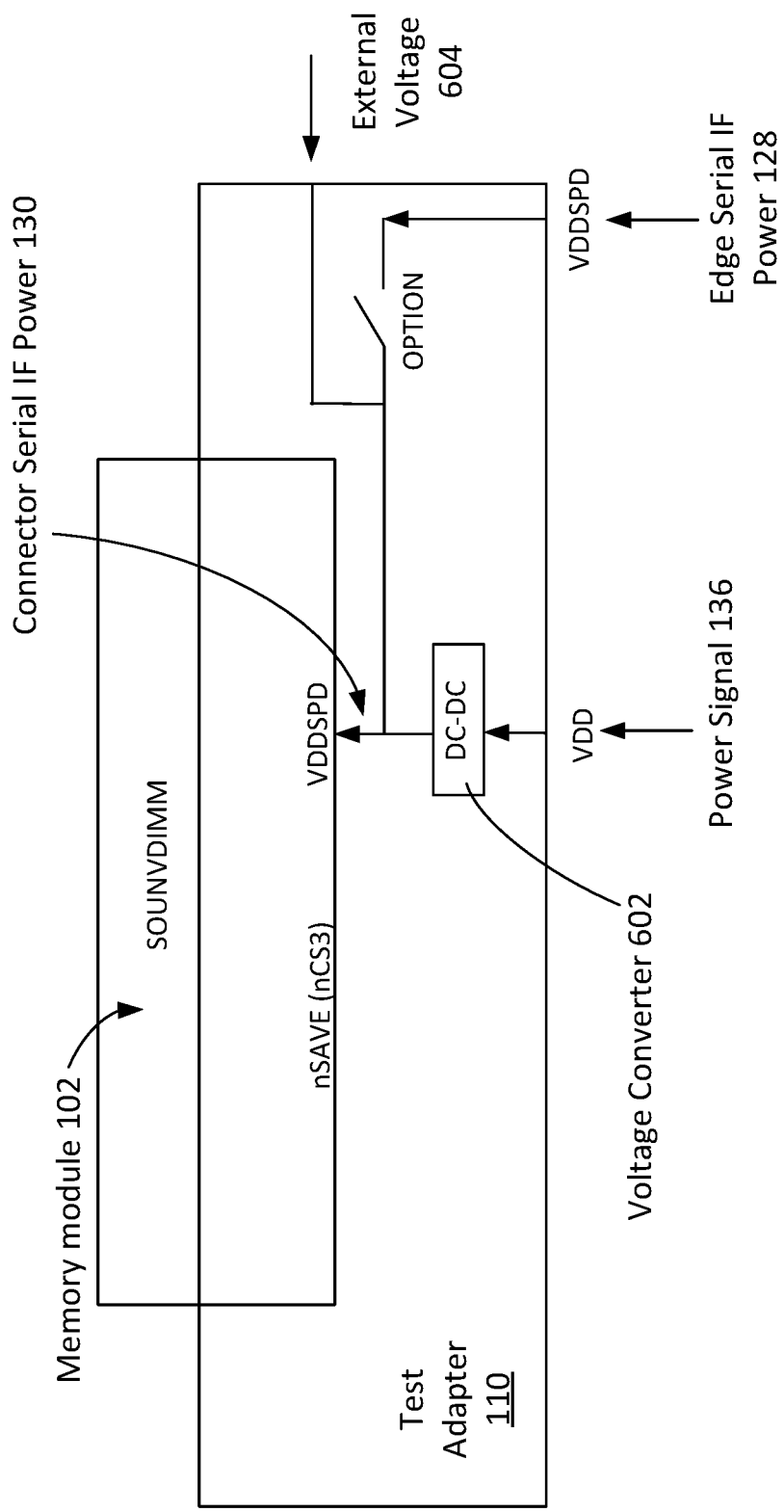
FIG. 6 is an example diagram of one of test adapters for a customized memory module, according to an embodiment.

FIG. 6 is an example diagram of one of test adapters 110 for a customized memory module 102, according to an embodiment. FIG. 6 is only one example of a manner in which test adapters 110 may be implemented in accordance with the described techniques. In other embodiments, multiple test adapters 110 may be implemented using process flows that include fewer or additional elements, with different components. For example, memory module 102 may be a small outline non-volatile memory module (SOUNVDIMM) or any other memory modules with non-volatile and volatile memories.

In an embodiment, memory module 102 may be a customizable module for a customer design. For example, memory module 102 may have a specific VDDSPD voltage for connector serial interface power 130, which may be specified to be greater than a voltage that an ATE can supply. As such, a voltage converter 602 may be implemented in each test adapter 110 to increase, boost, or step-up a voltage to connector serial interface power 130 from power signal 136 of an ATE. Voltage converter 602 is a DC-to-DC power converter that steps up voltage (while stepping down current) from its input (supply) to its output (load). An output of voltage converter 602 may be connected to memory module 102 to provide power to an SPD power input of memory module 102 for testing of volatile memories 104 and non-volatile memories 106 on memory module 102 using an ATE.

For example, voltage converter 602 may be a boost converter or a step-up converter. Also, for example, voltage converter 602 may be characterized as a switched-mode power supply (SMPS) containing at least two semiconductors (e.g., a diode and a transistor or any other devices) and at least one energy storage element (e.g., a capacitor, inductor, or a combination thereof). Further, for example, to reduce voltage ripple, filters implemented using capacitors (or in combination with inductors) may be added to an output of voltage converter 602 (e.g., a load-side filter) or an input of voltage converter 602 (e.g., a supply-side filter).

In an embodiment, test adapters 110 may optionally receive edge serial interface power 128. Edge serial interface power 128 may be directly connected to a VDDSPD input of memory module 102. Edge serial interface power 128 may have an adequate voltage specified for memory module 102 and may be greater than a voltage that an ATE can supply. If edge serial interface power 128 has an adequate voltage supplied to memory module 102, test adapters 110 may not include or may disable voltage converter 602 and external voltage 604. For example, test adapters 110 may optionally include a switch device, including but is not limited to a mechanical switch, a jumper, a zero-ohm resistor, or any other devices that electrically connect two or more terminals for connecting to edge serial interface power 128.

In an embodiment, test adapters 110 may receive an external voltage 604 from an external power supply. External voltage 604 may be directly connected to a VDDSPD input of memory module 102. External voltage 604 may have an adequate voltage specified for memory module 102 and may be greater than a voltage that an ATE can supply. If external voltage 604 has an adequate voltage supplied to memory module 102, test adapters 110 may not include or may disable voltage converter 602 and a switch device.

3.6. Multiple Test Adapters

Figure 7:
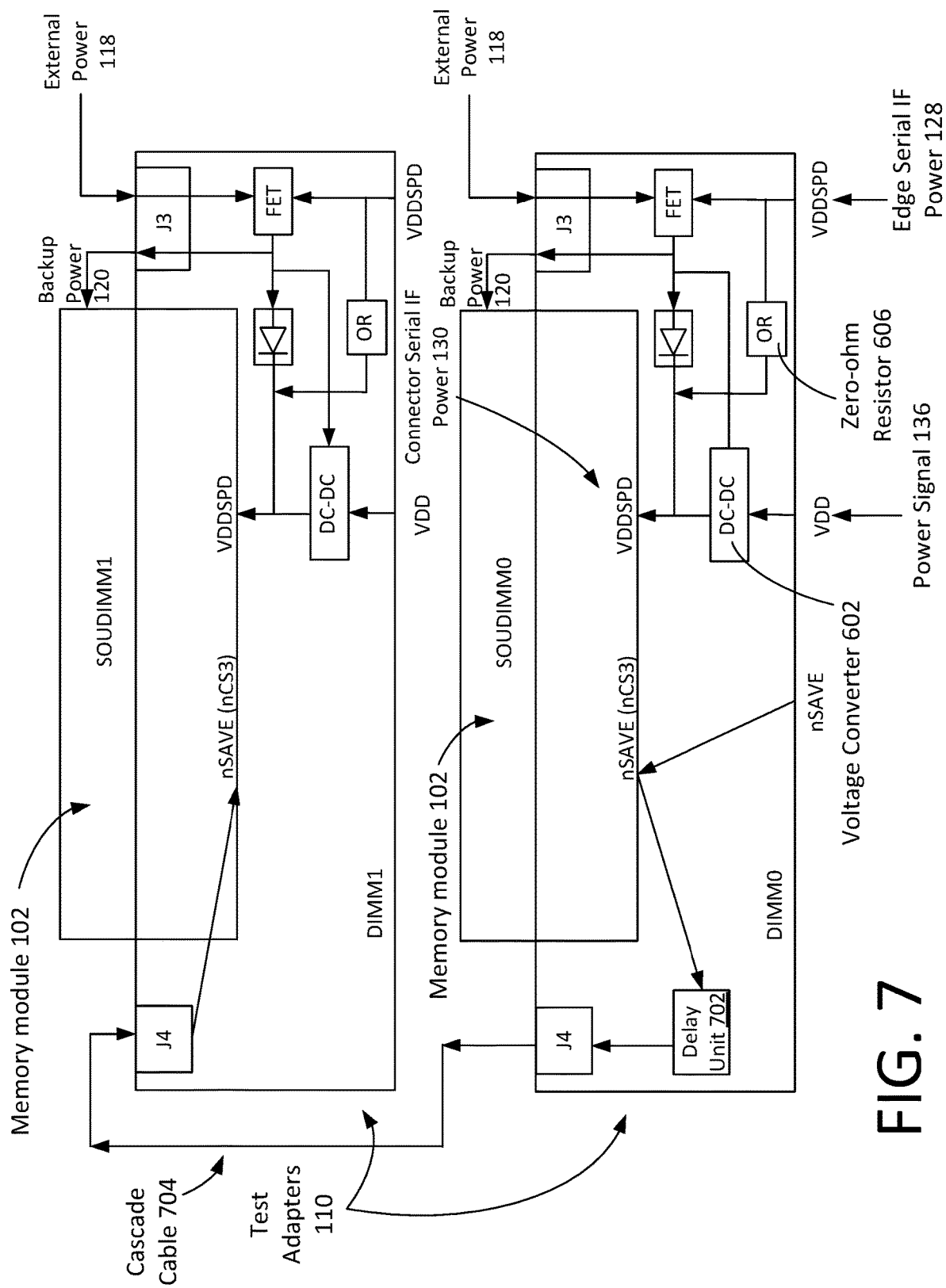
FIG. 7 is an example diagram of multiple test adapters cascaded in series, according to an embodiment.

FIG. 7 is an example diagram of multiple test adapters 110 cascaded in series, according to an embodiment. FIG. 7 is only one example of a manner in which test adapters 110 may be connected in accordance with the described techniques. In other embodiments, multiple test adapters 110 may be implemented using process flows that include fewer or additional elements, with different components. For example, the cascaded test adapters 110 may be used for tests performed on an ATE tester or for in-system level tests. The in-system level tests may be performed when test adapters 110 are used for memory modules 102 that are already installed in end-user systems, which are not in an ATE environment.

Backup of data in memory modules 102 is started using a backup command (nSAVE) issued by an ATE tester or an off-shelf test system. Memory modules 102 are not backed up at the same time. One memory module 102 in a first test adapter 110 is backed up, and then another memory module 102 in a second test adapter 110, which receives a delayed backup command (nSAVE) using a delay unit 702 in the first test adapter 110, is backed up after the backup completion in the first test adapter 110 is detected by monitoring the signal on a cascade cable 704 between two test adapters 110. Among other benefits, delay unit 702 is used for backup order arbitration to reduce power consumption of an end-user system during backup operations such that only one memory module 102 is backed up at a time. Only during backup operations of memory modules 102, external power 118 (Vin_ext) and backup power 120 (VBACK) are used. With memory modules 102 in a cascade configuration, it is possible to test all memory modules 102 in a normal (e.g., non-test) operating system environment. The backup command (nSAVE) may be delayed using delay unit 702 and then through a pin header, denoted as J4, of the first test adapter 110 before it is sent to the second test adapter 110 through another pin header (J4) of the second test adapter 110.

Each memory module 102 is inserted into a test adapter 110. The backup command may be implemented using chip select pins of test adapters 110 and memory modules 102. For example, test adapters 110 may be implemented using a custom design with predefined chip select pins that are not used for data transfer during normal (e.g., non-test) operation and available for selection of a physical bank or rank of memory module 102. For illustrative purposes, an active-low chip select #3 (nCS3), which is not used for normal (e.g., non-test) data transfers, may be used by an ATE tester for purposes of testing a backup operation.

Memory modules 102 operate using connector serial interface power 130. Volatile memories 104 on memory modules 102 may be tested using connector serial interface power 130 to verify internal memory cells of volatile memories 104. Connector serial interface power 130 may be used during testing of a memory backup operation of storing data from volatile memories 104 to non-volatile memories 106 and a memory restore operation of reading data from non-volatile memories 106 and write it back to volatile memories 104.

In an embodiment, memory modules 102 may be manufactured specifically for a customer design. For example, memory modules 102 may have a specific VDDSPD current from connector serial interface power 130, which may be greater than a voltage that an ATE can supply. As such, voltage converter 602 may be implemented in test adapters 110 to boost or step-up a voltage from power signal 136. An output of voltage converter 602 may be connected to memory modules to provide power to an SPD power input of each memory module 102 for testing of volatile memories 104 on the memory module 102 using an ATE. Edge serial interface power 128 is input to each test adapter 110.

In an embodiment, connector serial interface power 130 may be supplied by edge serial interface power 128. Connector serial interface power 130 may be externally supplied by edge serial interface power 128 through a zero-ohm resistor 606, denoted as 0R. As such, connector serial interface power 130 has a voltage that is approximately equal to edge serial interface power 128. For example, zero-ohm resistor 606 may be implemented using a jumper wire or a discrete component with a zero-ohm resistance. Edge serial interface power 128 is input to each test adapter 110.

In an embodiment, connector serial interface power 130 may be supplied by external power 118 through a transistor (e.g., FET or any other types of transistors) and a diode. The transistor may be enabled by edge serial interface power 128. For example, edge serial interface power 128 may be fed to a gate input of an n-channel FET transistor and a source input of the transistor may be connected to external power 118 supplied through a pin header, denoted as J3. In this example, a drain output of the transistor may be connected to a diode that is connected to connector serial interface power 130. The drain output may supply power to backup power 120 to memory modules 102 through the pin header J3.

3.7. Multiple Adapter Isometric View

Figure 8:
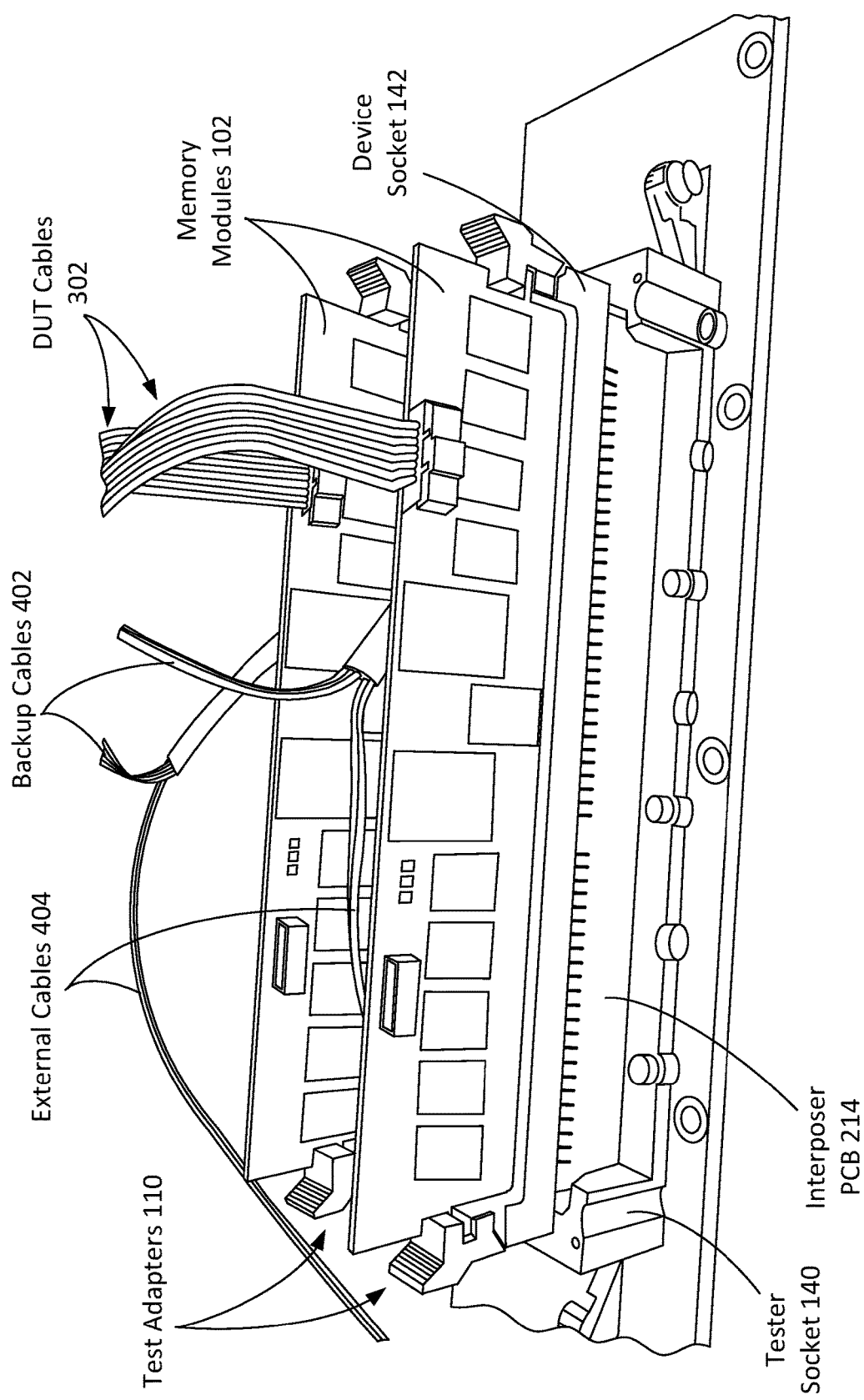
FIG. 8 is an example isometric view of multiple test adapters, according to an embodiment.

FIG. 8 is an example isometric view of multiple test adapters 110, according to an embodiment. Each memory module 102 may be inserted into device socket 142, which is attached to interposer PCB 214 over tester socket 140 of an ATE. Tester socket 140 may be mounted on a PCB of an ATE tester or on an in-system board. Wires of backup cables 402 may be connected to wires of DUT cables 302.

Backup cables 402 and external cables 404 are inserted into or attached to power sockets 208. Although power sockets 208 are not shown, power sockets 208 may be mounted on the back sides of interposer PCBs 214, to where backup cables 402 and external cables 404 are attached.

3.8. Tester Setup

Figure 9:
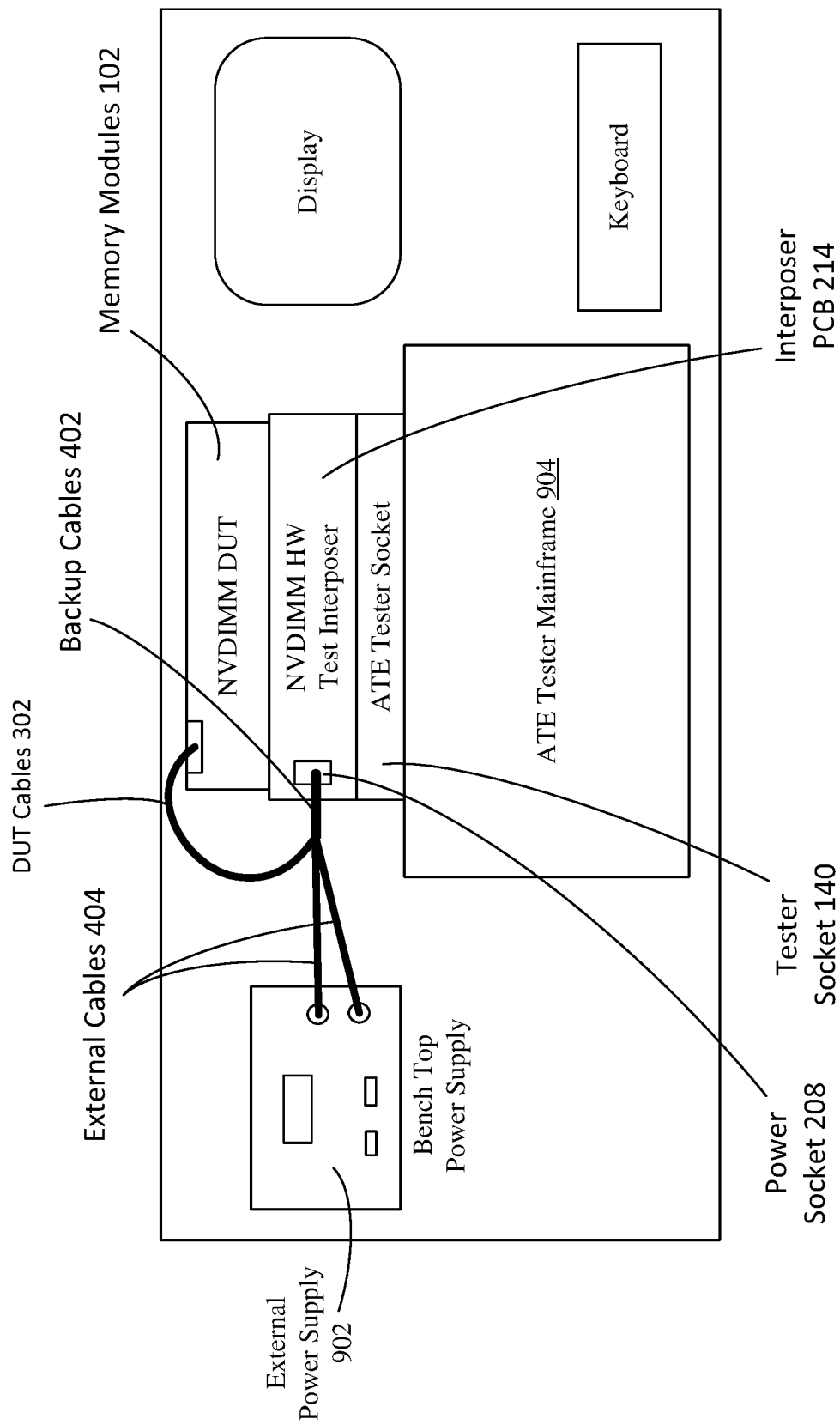
FIG. 9 is an example block diagram of an automatic test equipment (ATE) tester setup according to an embodiment.

FIG. 9 is an example block diagram of an automatic test equipment (ATE) tester setup, according to an embodiment. An external power supply 902 supplies power and ground signals through external cables 404 to interposer PCB 214. Interposer PCB 214 generates backup power 120, which is provided to memory modules 102 through backup cables 402 and DUT cables 302. Backup cables 402 and external cables 404 are inserted into or attached to power sockets 208. Wires of backup cables 402 may be connected to wires of DUT cables 302.

3.9. Process Flow

Figure 10:
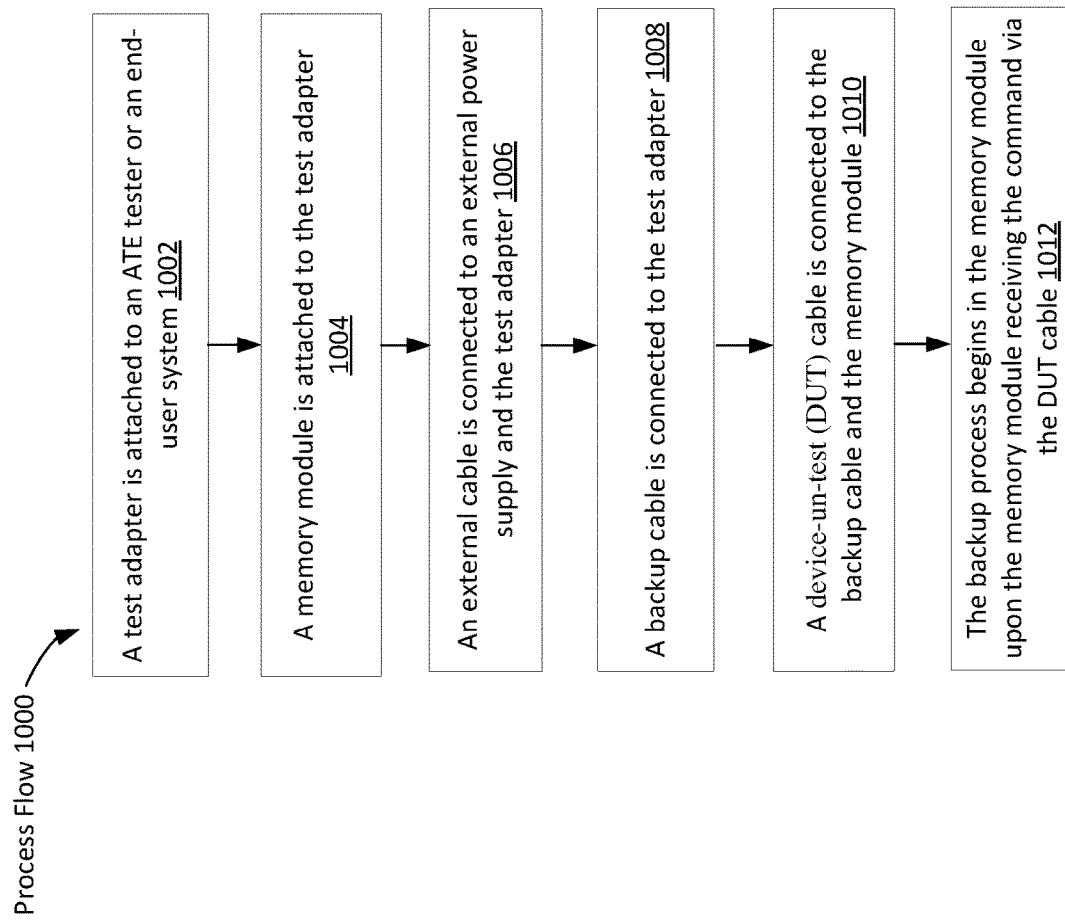
FIG. 10 is an example process flow for utilizing test adapters, in accordance with one or more embodiments.

FIG. 10 is an example process flow 1000 for utilizing test adapters 110, in accordance with one or more embodiments. Flow 1000 may be implemented, for example, in a computer system such as system 100. FIG. 10 illustrates only one possible flow for practicing the described techniques. Other embodiments may include fewer, additional, or different elements, in varying arrangements. Moreover, it will be recognized that the sequence of blocks is for convenience in explaining the process flow only, as the blocks themselves may be performed in various orders and/or concurrently.

In block 1002, a test adapter, such as test adapter 110, is attached to an ATE tester or an end-user system. The test adapter includes an edge connector, such as edge connector 116, attached to or inserted into a tester socket, such as tester socket 140, on the ATE tester or the end-user system.

In block 1004, a memory module, such as memory module 102, is attached to the test adapter. The memory module includes volatile memories, such as volatile memories 104, and non-volatile memories, such as non-volatile memories 106. The memory module is attached to or inserted into a device socket, such as device socket 142, of the test adapter. The device socket is attached or connected to a test straddle connector, such as test straddle connector 114, of an interposer PCB, such as interposer PCB 214.

In block 1006, an external cable, such as external cable 404, is connected to an external power supply and the test adapter. The external cable is connected an external power connector, such as external power connector 112, of a power socket, such as power socket 208, that is mounted directly on an exterior sidewall of the interposer PCB. The external cable includes a wire for supplying an external power, such as external power 118.

In block 1008, a backup cable, such as backup cable 402, is connected to the test adapter. The backup cable is connected to the external power connector. The backup cable includes a wire for supplying a backup power, such as backup power 120, and another wire for carrying a signal that indicates a backup voltage alert, such as backup voltage alert 124.

In block 1010, a device-under-test (DUT) cable, such as DUT cable 302, is connected to the backup cable and the memory module. The DUT cable includes at least one wire for supplying the backup power, a ground signal, such as ground 304, and the backup voltage alert. The DUT cable may include a wire that is used by the ATE tester or the end-user system to initiate a command issued to the memory module to start a backup process of saving data from the volatile memories to the non-volatile memories when a power failure event occurs and a restore process of reading data from the non-volatile memories and writing them back to the volatile memories to restore the states of the volatile memories just before the power failure event occur. The command may be issued using a combination of at least a serial interface bus, such as serial interface bus 138, and an input/output expander, such as input/output expander 148.

In block 1012, the backup process begins in the memory module upon the memory module receiving the command from the ATE tester or the end-user system via the DUT cable. The backup process completes when all data stored in the volatile memories are saved to the non-volatile memories. The backup process occurs when an unexpected power loss, a system crash, or a normal system shutdown occurs. After a system is powered back up, the restore process begins to read data from the non-volatile memories and write the data back to the volatile memories.

4.0. Example Embodiments

Examples of some embodiments are represented, without limitation, in the following clauses:

According to an embodiment, a system comprises: a tester socket; a test adapter attached to the tester socket, the test adapter having an interposer printed circuit board (PCB) and a device socket, the interposer PCB having an edge connector, a test straddle connector, and a power socket, the edge connector attached to the tester socket, the test straddle connector attached to the device socket, the power socket having an external power connector connected to an external cable for receiving an external power from an external power supply and a backup cable for supplying a backup power based on external power; and a memory module, having a volatile memory and a non-volatile memory, attached to the device socket and connected to the backup power.

In an embodiment, the interposer PCB includes a serial interface bus and an input/output device, the input/output device is configured through the serial interface bus, and the backup power is supplied based on the input/output device.

In an embodiment, the test adapter includes series diodes between a wire carrying a connector serial interface power of the test straddle connector and another wire carrying the backup power, voltages of the connector serial interface power and the backup power are different based on a voltage drop across the series diodes.

In an embodiment, the system further comprises a backup cable connected to the external power connector and a device-under-test (DUT) cable connected to the backup cable and the memory module for carrying the backup power from the backup cable to the memory module.

In an embodiment, the test straddle connector is for supplying a connector serial interface power to the memory module, the backup power is greater than the connector serial interface power.

In an embodiment, the system further comprises a backup cable and a device-under-test (DUT) cable having multiple wires connected to a wire of the backup cable, the multiple wires connected to the memory module for supplying the backup power from the wire of the backup cable to the memory module.

In an embodiment, the test straddle connector is for supplying a connector serial interface power to the memory module, the backup power is turned on while the connector serial interface power is on, and the connector serial interface power is turned off after the backup power is on for a predetermined amount of time.

In an embodiment, the system further comprises a backup cable connected to the external power connector, the backup cable having a wire for a backup voltage alert that indicates a problem with the backup power.

According to an embodiment, a system comprises: a tester socket; a test adapter having an interposer printed circuit board (PCB) and a device socket, the interposer PCB having an edge connector, a test straddle connector, and a connector serial interface power, the edge connector attached to the tester socket, the test straddle connector attached to the device socket; and a memory module having a volatile memory and a non-volatile memory and attached to the device socket and connected to the connector serial interface power through the test straddle connector.

In an embodiment, the test adapter includes a voltage converter for generating the connector serial interface power based on an edge serial interface power input to the test adapter.

In an embodiment, the system further comprises a second test adapter adjacent the test adapter, the second test adapter having a second interposer PCB and a second device socket, the second interposer PCB having a second test straddle connector; and a second memory module having a second volatile memory and a second non-volatile memory and attached to the second device socket and connected to a second connector serial interface power through the second test straddle connector.

In an embodiment, the test adapter receives a save command for the memory module to save data from the volatile memory to the non-volatile memory, includes a delay unit for delaying the save command; and the second test adapter receives the delayed save command to save data from the second volatile memory to the second non-volatile memory.

According to an embodiment, a method comprises: attaching a test adapter to a tester socket, the test adapter having an interposer printed circuit board (PCB) and a device socket, the interposer PCB having an edge connector, a test straddle connector, and a power socket, the edge connector attached to the tester socket, the test straddle connector attached to the device socket; connecting the power socket having an external power connector to an external cable for receiving an external power from an external power supply and a backup cable for supplying a backup power based on external power; attaching a memory module, having a volatile memory and a non-volatile memory, to the device socket; and connecting the memory module to the backup power.

In an embodiment, the method further comprises: configuring an input/output device of the interposer PCB through a serial interface bus on the interposer PCB, wherein the backup power is supplied based on the input/output device.

In an embodiment, the test adapter includes series diodes between a wire carrying a connector serial interface power of the test straddle connector and another wire carrying the backup power, voltages of the connector serial interface power and the backup power are different based on a voltage drop across the series diodes.

In an embodiment, the method further comprises: connecting a backup cable to the external power connector; and connecting a device-under-test (DUT) cable to the backup cable and the memory module for carrying the backup power from the backup cable to the memory module.

In an embodiment, the test straddle connector is for supplying a connector serial interface power to the memory module, the backup power is greater than the connector serial interface power.

In an embodiment, the method further comprises: connecting a device-under-test (DUT) cable having multiple wires to a wire of a backup cable, the multiple wires connected to the memory module for supplying the backup power from the wire of the backup cable to the memory module.

In an embodiment, the method further comprises: supplying a connector serial interface power to the memory module through the test straddle connector; turning on the backup power while the connector serial interface power is on; and turning off the connector serial interface power after the backup power is on for a predetermined amount of time.

In an embodiment, the method further comprises: connecting a backup cable to the external power connector, the backup cable having a wire for a backup voltage alert that indicates a problem with the backup power.

Other examples of these and other embodiments are found throughout this disclosure.

5.0. Extensions and Alternatives

As used herein, the terms "first," "second," "certain," and "particular" are used as naming conventions to distinguish queries, plans, representations, steps, objects, devices, or other items from each other, so that these items may be referenced after they have been introduced. Unless otherwise specified herein, the use of these terms does not imply an ordering, timing, or any other characteristic of the referenced items.

In the drawings, the various components are depicted as being communicatively coupled to various other components by arrows. These arrows illustrate only certain examples of information flows between the components. Neither the direction of the arrows nor the lack of arrow lines between certain components should be interpreted as indicating the existence or absence of communication between the certain components themselves. Indeed, each component may feature a suitable communication interface by which the component may become communicatively coupled to other components as needed to accomplish any of the functions described herein.

In the foregoing specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. In this regard, although specific claim dependencies are set out in the claims of this application, it is to be noted that the features of the dependent claims of this application may be combined as appropriate with the features of other dependent claims and with the features of the independent claims of this application, and not merely according to the specific dependencies recited in the set of claims. Moreover, although separate embodiments are discussed herein, any combination of embodiments and/or partial embodiments discussed herein may be combined to form further embodiments.

Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A system comprising:
a tester socket;
a test adapter attached to the tester socket, the test adapter having an interposer printed circuit board (PCB) and a device socket, the interposer PCB having an edge connector, a test straddle connector, and a power socket, the edge connector attached to the tester socket, the test straddle connector attached to the device socket, the power socket having an external power connector connected to an external cable for receiving an external power from an external power supply and a backup cable for supplying a backup power based on the external power; and
    wherein a memory module having a volatile memory and a non-volatile memory is attached to the device socket and connected to the backup power through the backup cable connected to the power socket;
a second test adapter adjacent the test adapter, the second test adapter having a second interposer PCB and a second device socket, the second interposer PCB having a second test straddle connector; and
a second memory module having a second volatile memory and a second non-volatile memory and attached to the second device socket and connected to a second serial interface power through the second test straddle connector.

2. The system as recited in claim 1, wherein the interposer PCB includes a serial interface bus and an input/output device, the input/output device is configured through the serial interface bus, and the backup power is supplied based on the input/output device.

3. The system as recited in claim 1, wherein the test adapter includes series diodes between a wire carrying a serial interface power of the test straddle connector and another wire carrying the backup power, voltages of the serial interface power and the backup power are different based on a voltage drop across the series diodes.

4. The system as recited in claim 1, further comprising:
the backup cable connected to the external power connector; and
a device-under-test (DUT) cable connected to the backup cable and the memory module for carrying the backup power from the backup cable to the memory module.

5. The system as recited in claim 1, wherein the test straddle connector is for supplying a serial interface power to the memory module, the backup power is greater than the serial interface power.

6. The system as recited in claim 1, further comprising:
a device-under-test (DUT) cable having multiple wires connected to a wire of the backup cable, the multiple wires connected to the memory module for supplying the backup power from the wire of the backup cable to the memory module.

7. The system as recited in claim 1, wherein the test straddle connector is for supplying a serial interface power to the memory module, the backup power is turned on while the serial interface power is on, and the serial interface power is turned off after the backup power is on for a predetermined amount of time.

8. The system as recited in claim 1, further comprising the backup cable connected to the external power connector, the backup cable having a wire for a backup voltage alert that indicates a problem with the backup power.

9. A system comprising:
a tester socket;
a test adapter having an interposer printed circuit board (PCB) and a device socket, the interposer PCB having an edge connector, a test straddle connector, and a serial interface power, the edge connector attached to the tester socket, the test straddle connector attached to the device socket; and
    wherein a memory module having a volatile memory and a non-volatile memory is attached to the device socket and connected to the serial interface power through the test straddle connector;
a second test adapter adjacent the test adapter, the second test adapter having a second interposer PCB and a second device socket, the second interposer PCB having a second test straddle connector; and
a second memory module having a second volatile memory and a second non-volatile memory and attached to the second device socket and connected to a second serial interface power through the second test straddle connector.

10. The system as recited in claim 9, wherein the test adapter includes a voltage converter for generating the serial interface power based on a power signal input to the test adapter.

11. The system as recited in claim 9, wherein:
the test adapter receives a save command for the memory module to save data from the volatile memory to the non-volatile memory, includes a delay unit for delaying the save command; and
the second test adapter receives the delayed save command to save data from the second volatile memory to the second non-volatile memory.

12. A method comprising:
attaching a test adapter to a tester socket, the test adapter having an interposer printed circuit board (PCB) and a device socket, the interposer PCB having an edge connector, a test straddle connector, and a power socket, the edge connector attached to the tester socket, the test straddle connector attached to the device socket;
connecting the power socket having an external power connector to an external cable for receiving an external power from an external power supply and a backup cable for supplying a backup power based on external power; and
    wherein a memory module having a volatile memory and a non-volatile memory is attached to the device socket and connected to the backup power through the backup cable connected to the power socket;
attaching a second test adapter adjacent the test adapter, the second test adapter having a second interposer PCB and a second device socket, the second interposer PCB having a second test straddle connector; and
attaching a second memory module having a second volatile memory and a second non-volatile memory and attached to the second device socket and connected to a second serial interface power through the second test straddle connector.

13. The method as recited in claim 12, further comprising configuring an input/output device of the interposer PCB through a serial interface bus on the interposer PCB, wherein the backup power is supplied based on the input/output device.

14. The method as recited in claim 12, wherein the test adapter includes series diodes between a wire carrying a serial interface power of the test straddle connector and another wire carrying the backup power, voltages of the serial interface power and the backup power are different based on a voltage drop across the series diodes.

15. The method as recited in claim 12, further comprising:
connecting the backup cable to the external power connector; and
connecting a device-under-test (DUT) cable to the backup cable and the memory module for carrying the backup power from the backup cable to the memory module.

16. The method as recited in claim 12, wherein the test straddle connector is for supplying a serial interface power to the memory module, the backup power is greater than the serial interface power.

17. The method as recited in claim 12, further comprising connecting a device-under-test (DUT) cable having multiple wires to a wire of the backup cable, the multiple wires connected to the memory module for supplying the backup power from the wire of the backup cable to the memory module.

18. The method as recited in claim 12, further comprising:
- supplying a serial interface power to the memory module through the test straddle connector;
- turning on the backup power while the serial interface power is on; and
- turning off the serial interface power after the backup power is on for a predetermined amount of time.

19. The method as recited in claim 12, further comprising connecting the backup cable to the external power connector, the backup cable having a wire for a backup voltage alert that indicates a problem with the backup power.

\* \* \* \* \*